United States Patent [19]

Koshino et al.

[11] 4,415,372
[45] Nov. 15, 1983

[54] METHOD OF MAKING TRANSISTORS BY ION IMPLANTATIONS, ELECTRON BEAM IRRADIATION AND THERMAL ANNEALING

[75] Inventors: Yutaka Koshino; Toshio Yonezawa, both of Yokosuka; Takashi Ajima, Tokyo; Jiro Ohshima, Yokohama, all of Japan

[73] Assignee: Tokyo Shibaura Denki Kabushiki Kaisha, Kawasaki, Japan

[21] Appl. No.: 313,332

[22] Filed: Oct. 20, 1981

[30] Foreign Application Priority Data

Oct. 24, 1980 [JP] Japan .................................. 55-148357

[51] Int. Cl.$^3$ .......................................... H01L 21/263
[52] U.S. Cl. .................................. 148/1.5; 29/576 B; 29/576 T; 148/187; 357/91
[58] Field of Search ............... 148/1.5, 187; 29/576 B, 29/576 T; 357/91

[56] References Cited

U.S. PATENT DOCUMENTS

| | | | |
|---|---|---|---|
| 3,533,857 | 10/1970 | Mayer et al. | 148/1.5 |
| 3,653,977 | 4/1972 | Gale | 148/1.5 |
| 3,950,187 | 4/1976 | Kirkpatrick | 148/1.5 |
| 4,181,538 | 1/1980 | Narayan et al. | 148/1.5 |
| 4,187,126 | 2/1980 | Radd et al. | 148/1.5 |

OTHER PUBLICATIONS

Suski et al., Radiation Effects, 29 (1976), 137.
Greenwald et al., J. Appl. Phys., 50 (1979), 783.
Rai-Choudhury et al., IEEE Trans. Electron Devices, 23 (1976), 814.
Ratnakumar et al., J. Vac. Sci. Technol., 16 (1979), 1843.
Neukermans et al., J. Vac. Sci. Technol., 16 (1979), 1847.
Yamamoto et al., J. Appl. Phys., 53 (1982), 276.

Primary Examiner—Upendra Roy
Attorney, Agent, or Firm—Finnegan, Henderson, Farabow, Garrett & Dunner

[57] ABSTRACT

The invention provides a method for fabricating a semiconductor device which comprises the steps of ion-implanting an impurity into a monocrystalline semiconductor substrate; irradiating the region into which the impurity ions have been implanted with an accelerated electron beam under the conditions that the acceleration voltage is 20 to 200 KeV, and the current is 0.01 to 1 mA and the exposure dose is $10^{20}$ to $10^{15}/cm^2$; and carrying out annealing to form a semiconductor region of one conductivity type. According to the present invention, a semiconductor device can be fabricated which has fewer lattice defects and in which the lifetime of the carriers is long.

5 Claims, 6 Drawing Figures

|⎯⎯⎯1000Å⎯⎯⎯|

PRIOR ART FIG. 1B

|⎯⎯⎯1000Å⎯⎯⎯|

METHOD OF MAKING TRANSISTORS BY ION IMPLANTATIONS, ELECTRON BEAM IRRADIATION AND THERMAL ANNEALING

BACKGROUND OF THE INVENTION

The present invention relates to a method for fabricating a semiconductor device which comprises a step of forming a semiconductor region in a semiconductor substrate by ion implantation.

A thermal diffusion process has been known as one of the methods for doping a p-type or n-type impurity into a semiconductor substrate which is composed of monocrystalline silicon, monocrystalline germanium or the like. In this diffusion process, an impurity at high temperature is diffused into the surface of the semiconductor substrate. However the method of ion implantation has been developed recently and has found wider applications. In ion implantation, impurity ions are accelerated directly at a high voltage, and are implanted into a semiconductor substrate from the surface thereof. This method allows control of the distribution of the impurity more easily than the thermal diffusion process, so that the impurity can be implanted at a higher concentration. In addition, those impurities which cannot be diffused by thermal diffusion can be implanted, which is another advantage of the ion implantation method. Therefore, ion implantation is used as a method for fabricating a semiconductor device of high precision without variation. Annealing is performed in this method to correct crystal defects produced during the ion implantation of the impurity as well as to activate the implanted ions. However, this annealing has the following difficulties: if ions are implanted at high concentration and the ion-implanted region has become uncrystallized, the activation of the impurity ions and the recrystallization of the crystals are achieved by the annealing, but small local segregation of impurity ions are formed. Alternatively, if ions are implanted at a relatively low concentration and the ion-implanted region is not uncrystallized, the impurity ions are activated by the annealing, but the crystals are not well reoriented. Therefore, ion tracks which are distortions of the crystal structure which the impurity ions have disoriented traverse the region until they are stopped in the crystals. In either case, there remain a number of crystal defects in the ion-implanted region. This significantly reduces the lifetime of the carriers produced by the ion implantation and damages the function of the semiconductor device.

SUMMARY OF THE INVENTION

The present invention has for its object to provide a method for fabricating a semiconductor device according to which the local high-density segregation and the formation of ion tracks can be prevented, whereby the lattice defects can be decreased and the lifetime of the carriers can be prolonged. This object can be achieved by a method for fabricating a semiconductor device comprising the steps of:

ion-implanting impurity ions into a monocrystalline semiconductor substrate;

irradiating a region into which the impurity ions have been implanted with an accelerated electron beam under the conditions that the acceleration voltage is 20 to 200 KeV, the current value is 0.01 to 1 mA, and the exposure dose is $10^{12}$ to $10^{15}$/cm$^2$; and carrying out annealing to form a semiconductor region of one conductivity type.

BRIEF DESCRIPTION OF THE DRAWINGS

FIG. 1B is a similar micrograph of a semiconductor region formed by conventional ion implantation;

FIG. 3B is a similar micrograph of a semiconductor region formed by conventional ion implantation.

DETAILED DESCRIPTION OF THE PREFERRED EMBODIMENTS

The present invention will be further described on the basis of experimental examples.

EXAMPLE 1

Boron ions were implanted as impurity ions into a semiconductor substrate composed of monocrystalline silicon at an exposure dose of $5 \times 10^{14}$/cm$^2$ and at an acceleration voltage of 100 KeV. Then, the implanted surfaces were irradiated with an accelerated electron beam for twenty minutes at an acceleration voltage of 200 KeV and a current value of 0.2 mA to activate the ions. Thereafter, annealing was performed in an oven at a high temperature of 1,200° C. At this point of time, the diffusion thickness $X_j$ of the implanted ion layer was 2.5 μm and the surface concentration Ns was $5 \times 10^{18}$/cm$^3$.

Figure 1A:
FIG. 1A is a micrograph, taken with a transmission electron microscope, of a semiconductor region formed by ion implantation according to the present invention.
Figure 1A:
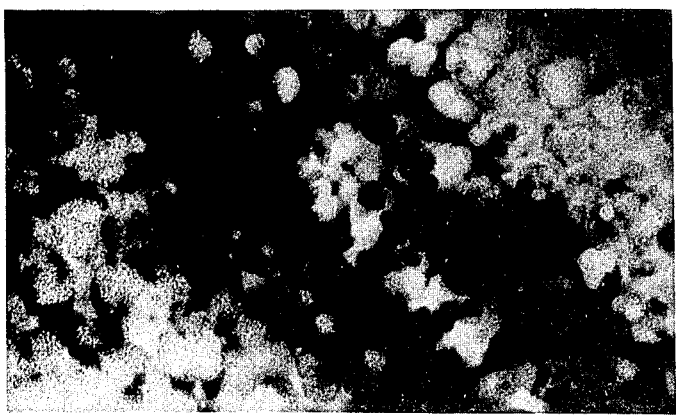

When the surface of the ion-implanted region formed in the example described above was observed with a transmission electron microscope, a photograph as shown in FIG. 1A was obtained. The granular portions correspond to regions with distortions in the crystal structure of the semiconductor substrate due to local segregation of impurity ions. When this photograph was compared with a photograph (FIG. 1B) of an ion-implanted region formed by conventional ion implantation to obtain the same surface concentration and the same diffusion thickness of the ion-implanted layer, it was found that the local segregation was wider and uniform in the former case in contract with the fine local segregation at high density, and the effect obtainable with the annealing was improved in this example.

Figure 2:
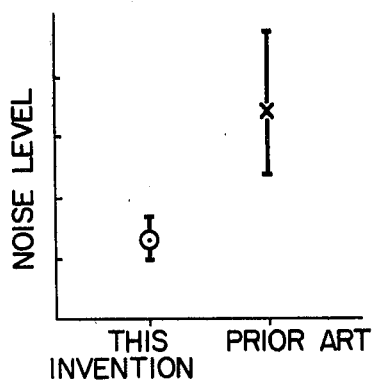
FIG. 2 is a graph showing the noise characteristics of an npn transistor fabricated by the method according to the present invention and an npn transistor fabricated by conventional ion implantation for the sake of comparison.

An npn transistor was fabricated using a semiconductor element with a semiconductor region formed as described above, and the noise characteristics thereof were measured. It was shown that the transistor according to the present invention is far superior to a similar npn transistor fabricated by conventional ion implantation because of its lower noise level and smaller noise range (FIG. 2). In the example above, the npn transistor according to the present invention and the conventional npn transistor each had a base resistivity $\rho s$ of 160 $\Omega/\square$, a base junction depth $X_j$ of 3.0 $\mu m$, an emitter resistivity $\rho s$ of 10 $\Omega/\square$, and an emitter junction depth $X_j$ of 2.0 $\mu m$. The noise level was measured under the conditions that the collector current Ic was 1 mA, the collector voltage Vc was 5 V and the frequency was 10 Hz. The noise level is expressed by the formula $In\sqrt{hfe}$ (PA), where In denotes noise current, hfe denotes current amplification factor, and PA denotes pico ampere.

EXAMPLE 2

Boron ions were implanted into a silicon monocrystalline substrate at a low concentration, that is, at an exposure dose of $7\times10^{13}/cm^2$ and at an acceleration voltage of 100 KeV. Then, scanning and irradiation by an accelerated electron beam was performed for ten minutes at an acceleration voltage of 200 KeV and a current value of 0.5 mA to activate the ions. Annealing was subsequently carried out in an oven at a high temperature of 1,000° C.

Figure 3A:
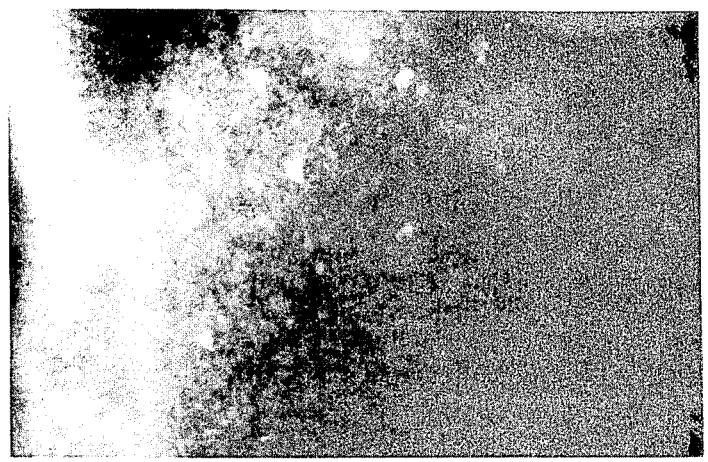
FIG. 3A is a micrograph, taken with a transmission electron microscope, of a semiconductor region formed by ion implantation at a low concentration according to the present invention.
Figure 3A:
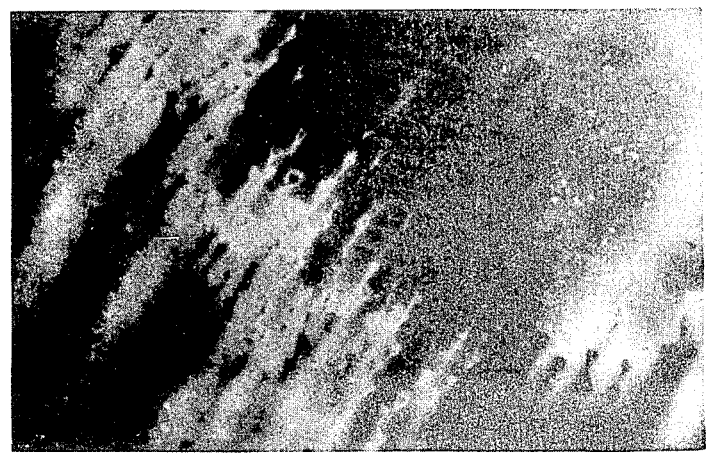

When the surface of the ion-implanted region formed in this example was observed with a transmissive electron microscope, a photograph as shown in FIG. 3A was obtained. It can be seen that, unlike the surface formed by the conventional ion implantation (FIG. 3B), no ion tracks were formed. In FIG. 3B, the black band portions correspond to the ion tracks regions where the implanted impurity ions disoriented the crystal structure of the semiconductor substrate and created distortions therein before the impurity ions stopped.

Figure 4:
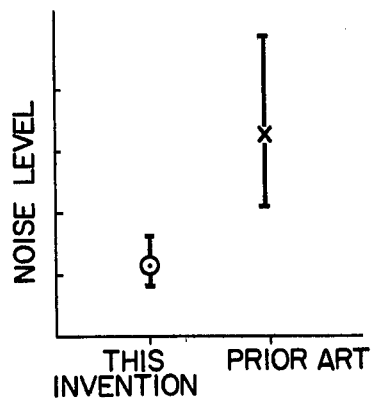
FIG. 4 is a graph showing the noise characteristics of an npn transistor fabricated by ion implantation at a low concentration according to the present invention and an npn transistor fabricated by ion-implantation at a low concentration according to conventional ion implantation.

An npn transistor was fabricated using a semiconductor element with a semiconductor region formed as described above, and the noise characteristics thereof were measured. It was found that this transistor is far superior to a transistor faricated according to conventional ion implantation, because of its low noise level and small noise range, as in Example 1 (FIG. 4).

In Example 2, the npn transistor according to the present invention and the conventional npn transistor each had a base resistivity $\rho s$ of 160 $\Omega/\square$, a base junction depth $X_j$ of 3.0 $\mu m$, an emitter resistivity $\rho s$ of 10 $\Omega/\square$, and an emitter junction depth $X_j$ of 2.0 $\mu m$. The noise level was measured under the conditions that the collector current Ic was 1 mA, the collector voltage Vc was 5 V and the frequency was 10 Hz.

Although the annealing was performed employing a high-temperature oven in the aforementioned Examples 1 and 2, a laser beam may be used for annealing in the present invention.

As is obvious from the examples above, in accordance with the present invention, impurity ions are activated by irradiation with an accelerated electron beam, whereby recrystallization of the region into which the impurity ions have been implanted can be effectively promoted while annealing is performed to prevent the formation of local segregation of the impurity ions at a high density, and the formation of ion tracks. Consequently, crystal defects in the ion-implanted region are significantly reduced, so that a semiconductor device having a longer lifetime can be fabricated. In short, the present invention enables fabrication of a semiconductor device of higher reliability.

It is to be noted that the semiconductor region formed by ion-implantation of an impurity according to the present invention shows much fewer local segregation of the impurity and therefore is far superior to a semiconductor region formed by diffusion of an impurity in a diffusion process.

What we claim is:

1. A method for fabricating a semiconductor device comprising the steps of:
    ion-implanting an impurity into a monocrystalline semiconductor substrate;
    irradiating a region into which said impurity ions have been implanted with an accelerated electron beam under the conditions that an acceleration voltage is 20 to 200 KeV, a current is 0.01 to 1 mA and an exposure dose is $10^{12}$ to $10^{15}/cm^2$; and
    carrying out annealing to form a semiconductor region of one conductivity type.

2. A method according to claim 1, wherein said semiconductor is silicon.

3. A method according to claim 1, wherein said semiconductor is germanium.

4. A method according to claim 1, wherein said annealing is a thermal annealing with a temperature of 1,000° C. or more.

5. A method according to claim 1, wherein said irradiation conditions comprise an irradiation time of ten minutes or more.

* * * * *

UNITED STATES PATENT AND TRADEMARK OFFICE
CERTIFICATE OF CORRECTION

PATENT NO. : 4,415,372
DATED : November 15, 1983
INVENTOR(S) : YUTAKA KOSHINO ET AL.

It is certified that error appears in the above—identified patent and that said Letters Patent is hereby corrected as shown below:

In the Title of the Invention, line 2, change "IMPLANTATIONS" to --IMPLANTATION--.

Signed and Sealed this

Seventh Day of February 1984

[SEAL]

Attest:

GERALD J. MOSSINGHOFF

Attesting Officer    Commissioner of Patents and Trademarks